United States Patent
Yamashita et al.

(10) Patent No.: US 6,716,324 B2
(45) Date of Patent: Apr. 6, 2004

(54) METHOD OF FORMING TRANSPARENT, CONDUCTIVE FILM, METHOD OF COMPENSATING DEFECTIVE REGION OF SEMICONDUCTOR LAYER, PHOTOVOLTAIC ELEMENT, AND METHOD OF PRODUCING PHOTOVOLTAIC ELEMENT

(75) Inventors: Toshihiro Yamashita, Kyoto (JP); Yasuyoshi Takai, Nara (JP); Hiroshi Izawa, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/058,802

(22) Filed: Jan. 30, 2002

(65) Prior Publication Data

US 2002/0144726 A1 Oct. 10, 2002

(30) Foreign Application Priority Data

Feb. 1, 2001 (JP) ........................................ 2001-025061

(51) Int. Cl.⁷ ........................ C23C 14/34; H01L 21/302; H01L 21/461
(52) U.S. Cl. .................... 204/192.12; 438/743; 438/778
(58) Field of Search ........................ 204/192.12, 192.15, 204/192.22, 298.06, 298.24; 438/743, 778

(56) References Cited

U.S. PATENT DOCUMENTS

| 4,356,073 | A |   | 10/1982 | McKelvey ................. 204/192 |
| 4,422,916 | A |   | 12/1983 | McKelvey ................. 204/192 |
| 4,451,970 | A |   | 6/1984 | Izu et al. ...................... 29/574 |
| 4,464,832 | A |   | 8/1984 | Asick et al. .................. 29/839 |
| 5,863,412 | A | * | 1/1999 | Ichinose et al. ............. 205/652 |
| 6,054,024 | A |   | 4/2000 | Toyama et al. ........ 204/192.29 |
| 6,290,821 | B1 | * | 9/2001 | McLeod ................ 204/192.12 |

FOREIGN PATENT DOCUMENTS

| JP | 10-92766 | 4/1998 | ......... H01L/21/285 |
| JP | 11-29863 | 2/1999 | ........... C23C/14/34 |

OTHER PUBLICATIONS

"Progress In The Application Of The Plasma Emission Monitor In Web Coating" S. Schiller, U. Heisig, Chr. Korndorfer, J. Strumpfel, V. Kirchhoff. Forschungsinstitut Manfred von Ardenne Zeppelinstrasse 7, Dresden, 8051, GDR. "Kinouzairyou" (Functional materials), vol. 11, No. 3, pp. 35 to 41, Mar. 1991.

* cited by examiner

Primary Examiner—Steven H. VerSteeg
(74) Attorney, Agent, or Firm—Fitzpatrick, Cella, Harper & Scinto

(57) ABSTRACT

Provided is a method of forming a transparent, conductive film on a semiconductor layer formed on a substrate, by sputtering, wherein voltages are applied independently of each other to both a target and the substrate, respectively, and a bias voltage appearing in the substrate is controlled so as to form the transparent, conductive film on only a portion except for a defective region of the semiconductor layer, thereby restraining shunting of the transparent, conductive film and achieving excellent appearance thereof. Also provided are a defective region compensation method of a semiconductor layer, a photovoltaic element, and a method of producing the photovoltaic element.

9 Claims, 8 Drawing Sheets

METHOD OF FORMING TRANSPARENT, CONDUCTIVE FILM, METHOD OF COMPENSATING DEFECTIVE REGION OF SEMICONDUCTOR LAYER, PHOTOVOLTAIC ELEMENT, AND METHOD OF PRODUCING PHOTOVOLTAIC ELEMENT

BACKGROUND OF THE INVENTION

1. Field of the Invention

The present invention relates to a transparent, conductive film forming method of forming a transparent, conductive film on a semiconductor layer stacked on a substrate, by sputtering, a semiconductor-layer defective region compensation method of compensating a defective region produced in a semiconductor layer stacked on a substrate, a photovoltaic element in which a transparent, conductive film is formed by sputtering, on a semiconductor layer stacked on a substrate, and a method of producing a photovoltaic element.

2. Related Background Art

In recent years, various studies have been and are being conducted toward practical use of photovoltaic power generation by solar cells. In order to cover some of power demands by the solar cells, they need to meet the requirements of sufficiently high photoelectric conversion efficiency of solar cells used, excellent reliability, and capability of volume production.

First, common sputtering techniques will be described below.

In general, as methods of depositing a transparent, conductive film on a substrate by sputtering, there are two types of methods proposed: one is a method of effecting sputtering in Ar gas, using an oxide of $In_2O_3$—$SnO_2$ or the like as a target; the other is a reactive sputtering method of sputtering an alloy of In—Sn or the like in mixed gas of Ar and $O_2$. The former permits formation of a film with low electrical resistance and high transmittance immediately after sputtering, but involves the difficulty of increasing film forming rates.

On the other hand, the latter reactive sputtering method allows increase of film forming rates. Particularly, in the case of DC magnetron sputtering apparatus using a cylindrical, rotatable target, as described in U.S. Pat. Nos. 4,356,073 and 4,422,916, it is reported that the utilization efficiency of the target material is approximately 2.5 to 3 times higher than those of the general planar type (Kinouzairyou (Functional materials), Vol. 11, No. 3, pp. 35–41, March 1991). The advantages of this reactive sputtering method include saving of the target material and great decrease of production stop time for exchange of targets. Accordingly, the DC magnetron sputtering apparatus using the rotatable target is suitable for volume production.

This reactive sputtering, however, requires extremely narrow adequate ranges of film formation conditions, particularly, flow rates of gas; for example, where a transparent, conductive film was formed on a sheet-like substrate of a large area, it was difficult to control the film formation parameters such as evenness of sheet resistance and transmittance, discharge stability, and so on.

The reactive sputtering method employing a plasma emission monitor (hereinafter referred to as "PEM") is known as a method overcoming the disadvantage.

Reference should be made to S. Schiller, U. Heisig, Chr. Korndorfer, J. Strumpfel, V. Kirchhoff "Progress in the Application of the Plasma Emission Monitor in Web Coating" (Proceedings of the 2nd International Conference on Vacuum Web Coating, Fort Lauderdale, Fla., USA, October 1988).

This PEM is a device for collecting plasma emission by a collimator, guiding the emitted light through a spectroscope to a photomultiplier tube (photomultiplier), photoelectrically converting the light into an electric signal, and monitoring the state of the plasma, based on the electric signal. The device has a function of setting the sensitivity of the photomultiplier of the PEM at a certain value and regulating the flow rate of introduction of reactive gas so as to keep the emission intensity of the plasma constant.

Japanese Patent Application Laid-Open No. 11-29863 discloses the technique of forming a film of ITO (Indium Tin Oxide) on a substrate. This technique is generally a method of setting a substrate in a film forming chamber, inducing discharge in the film forming chamber in a state in which sputter gas is introduced and reactive gas is not introduced thereinto, adjusting the sensitivity of the device for monitoring the emission intensity of the plasma such that the emission intensity of the plasma of the discharge becomes a predetermined value, and sputtering the target while controlling the introducing amount of the reactive gas so as to keep the film forming rate constant. Namely, it is the technique of forming a uniform film by regulating the flow rate of introduction of the reactive gas ($O_2$) so as to keep the plasma emission intensity of In (at the wavelength=451.1 nm) constant during formation of the ITO film.

These techniques made it feasible to produce a satisfactorily good deposited film on a satisfactorily stable basis in the reactive sputtering methods.

The common defect removing techniques will be described below.

The amorphous silicon (hereinafter referred to as "a-Si") solar cells are drawing attention, because they can be produced at lower cost and have higher mass producibility than the solar cells produced using crystalline Si and others. The reason for it is that it is possible to use readily available gas such as silane or the like as source gas, decompose it by glow discharge, and form a deposited film of a semiconductor film or the like on a relatively inexpensive, belt-like substrate such as a metal sheet, a resin sheet, or the like.

Incidentally, the output power of about 3 kW is necessary for applying the solar cells to power supply at ordinary households. With use of the solar cells having the photoelectric conversion efficiency of 10%, the area in that case is 30 m², and it is thus necessary to prepare the solar cells of large area. It is, however, very hard to produce the solar cells without defects over a large area because of the production steps of solar cells.

For example, it is known that low-resistant portions appear at grain boundary regions in polycrystalline solar cells and that in the thin film solar cells such as those of a-Si, defects are produced by influence of dust or the like during formation of semiconductor layers to become the cause of shunts and decrease the photoelectric conversion efficiency and yield significantly.

Further, causes of production of defects and their effect include the following; for example, in the case of the a-Si solar cell deposited on a stainless steel substrate, the substrate surface cannot be regarded as a perfectly smooth surface, but has flaws and dents, a back surface reflecting layer of uneven structure is provided on the substrate for the purpose of effective use of incident light, it is thus difficult for thin film semiconductor layers several ten nm thick such as n- or p-layers to completely cover such a surface, defects are produced by dust or the like during film formation, and so on.

Where the semiconductor layers between the lower electrode and the upper electrode of the solar cell are lost because of the defects or the like to cause direct contact between the lower electrode and the upper electrode or where the semiconductor layers are not lost completely but themselves have a low resistance to cause shunts between the upper electrode and the lower electrode, the electric current generated by light will flow through the upper electrode into the low resistant regions of the shunt portions, resulting in loss of electric current. Such current loss will result in decrease of open circuit voltage of the solar cell.

Since in the a-Si solar cells the sheet resistance of the semiconductor layers themselves is generally high, they need to have the upper electrode consisting of a transparent, conductive film over the entire semiconductor surface. In general, the upper electrode is a transparent, electroconductive film such as films of $SnO_2$, $In_2O_3$, ITO ($In_2O_3+SnO_2$), and so on with excellent characteristics as to transparency to the visible light and electric conductivity. These transparent, conductive films are normally formed by sputtering, vacuum resistance heating evaporation, electron beam evaporation, spraying, and so on. When there exist defects in the semiconductor layers, a considerably large amount of electric current flows into the fine defects. If the defects are located apart from a grid electrode provided on the transparent, conductive film, the resistance is high against the flow of current into the defective portions and the power loss is thus relatively small. Conversely, if the defective portions are located below the grid electrode, the defects cause greater loss of electric current.

On the other hand, in addition to the leakage of charge generated in the semiconductor layers, into the defective portions, the defective portions under existence of water produce ionic substances because of interaction with water. They gradually decrease the electric resistance at the defective portions with a lapse of operating time during use of the solar cells, whereby there appears the phenomenon of degrading the characteristics of the photoelectric conversion efficiency and others.

Incidentally, when there occur shunts as described above, the current loss can be reduced by removing the upper electrode of the transparent, conductive film at positions of the shunts. As methods of selectively removing the upper electrode at the shunt portions, there are removing techniques of immersing the solar cell in an acid, salt, or alkali electrolyte and applying a bias to the solar cell to etch the shunt portions, as disclosed in U.S. Pat. Nos. 4,451,970 and 4,464,832.

However, while these techniques describe the bias applying method and the bias applying time according to the film thickness of the transparent, conductive film, if there exist many defective portions the upper electrode will become thin throughout the entire surface to cause decrease of the photoelectric conversion efficiency, deterioration of appearance, or the like.

Of the characteristics of the solar cells, the sheet resistance of the transparent, conductive film deposited on the semiconductor layer is considered to be preferably as low as possible. Decrease in the sheet resistance of the transparent, conductive film can decrease the series resistance of the solar cells and increase the fill factor in the current-voltage curve (I-V curve) of the solar cells. Further, the decrease in the sheet resistance of the transparent, conductive film can increase the current collection efficiency and if the grid electrode is formed by attachment of wires the number of grids can be decreased and loss of light due to shadows of wires (shadow loss) can be decreased.

With the decrease in the sheet resistance of the transparent, conductive film, however, if the transparent, conductive film is removed at the shunt portions by electrochemical reaction in the electrolyte as disclosed in U.S. Pat. Nos. 4,451,970 and 4,464,832, selectivity of removal will become worse when applying the bias to the solar cell. Namely, the current becomes easier to flow to the transparent, conductive film not only at the shunt portions but also at shuntless portions, so that the transparent, conductive film will also be gradually etched at the shuntless portions during the removal of the transparent, conductive film for its entire film thickness at the shunt portions, posing the problem of significant deterioration of the characteristics and appearance of the solar cell.

SUMMARY OF THE INVENTION

The present invention has been accomplished in view of the above problems and an object of the invention is to provide a method of forming a transparent, conductive film with excellent characteristics and high yield by sputtering, without causing the shunts or the deterioration of appearance, a defective region compensation method of a semiconductor layer, a photovoltaic element, and a method of producing a photovoltaic element.

In order to achieve the above object, a transparent, conductive film forming method according to the present invention is a method of forming a transparent, conductive film on a semiconductor layer formed on a substrate, by sputtering, comprising applying voltages independently of each other to both a target and the substrate, respectively, and controlling a bias voltage appearing in the substrate so as to form the transparent, conductive film on only a portion except for a defective region of the semiconductor layer.

Preferably, at least one of the voltages applied to the target and the substrate is controlled such that a self bias of the substrate is −20 V to 0 V in a state in which the voltage is applied to only the target and such that a self bias of the substrate is −90 V to −30 V in a state in which the voltages are applied to both the target and the substrate, respectively, independently of each other.

Preferably, an introducing amount of a reactive gas is controlled such that a ratio of emission intensity of In during formation of the transparent, conductive film in a state in which the voltages are applied to both the target and the substrate, respectively, independently of each other to emission intensity of In during discharge in only an Ar atmosphere is within the range of 0.15 to 0.36.

A defective region compensation method of a semiconductor layer according to the present invention is a method of compensating a defective region existing in a semiconductor layer formed on a substrate, comprising:

applying voltages to both a target and the substrate, respectively, independently of each other and controlling a bias voltage appearing in the substrate to form a transparent, conductive film by sputtering; and immersing the transparent, conductive film in an acid, salt, or alkali electrolyte and applying a bias.

A photovoltaic element producing method according to the present invention is a method of producing a photovoltaic element, comprising:

forming a semiconductor layer on a substrate; and forming a transparent, conductive film on the semiconductor layer by the forming method as described above.

A photovoltaic element producing method according to the present invention is a method of producing a photovoltaic element, comprising:

forming a semiconductor layer on a substrate; and compensating a defect existing in the semiconductor layer, by the compensating method as described above.

A photovoltaic element according to the present invention is a photovoltaic element comprising at least a semiconductor layer and a transparent, conductive film formed on the semiconductor layer, on a substrate, the photovoltaic element being produced by the method as described above.

A transparent, conductive film forming method according to the present invention is a method of forming a transparent, conductive film on a semiconductor layer formed on a substrate, by sputtering, comprising applying voltages independently of each other to a target and the substrate, respectively, so as to satisfy at least the following conditions of (1) and (2):

(1) a self bias of the substrate is −20 V to 0 V in a state in which the voltage is applied to only the target;

(2) a self bias of the substrate is −90 V to −30 V in a state in which the voltages are applied to both the target and the substrate, respectively, independently of each other.

DETAILED DESCRIPTION OF THE PREFERRED EMBODIMENTS

The preferred embodiments of the present invention will be described below, but it is noted that the present invention is by no means intended to be limited to the embodiments.

In a vacuum chamber of the present embodiment, there are provided independent, external power supplies for both a target and a substrate facing each other, and a device for monitoring the emission intensity of the plasma (hereinafter referred to as "PEM") according to necessity. The sensitivity of the photomultiplier is adjusted such that the emission intensity of In during discharge in only an Ar atmosphere becomes 900, a reactive gas ($O_2$) is then introduced, and a voltage is applied from the first power supply to the target such that a self bias appearing on the substrate becomes −20 V to 0 V. Subsequent thereto, a voltage is applied from the second power supply to the substrate such that the self bias of −90 V to −30 V appears on the substrate, and then film formation is started.

In the present embodiment, under adequate conditions that the transparent, conductive film was able to be formed only on portions except for defective regions of the semiconductor layers, i.e., under adequate conditions that substantially no, transparent, conductive film was formed on the defective regions, a ratio of emission intensities of In (a ratio of the emission intensity during formation of the transparent, conductive film to the emission intensity during discharge in only the Ar atmosphere (i.e., in a state without introduction of a reactive gas)) was within the range of 0.15 to 0.36.

Actual film formation is effected in an applying state of the voltages to both the target and the substrate. Accordingly, the voltages may be applied to both the target and the substrate from the beginning as long as the following conditions are met: the self bias of the substrate is −20 V to 0 V in a state in which the voltage is applied to only the target; and the self bias of the substrate is −90 V to −30 V in a state in which the voltages are applied to both the target and the substrate.

Figure 9A:
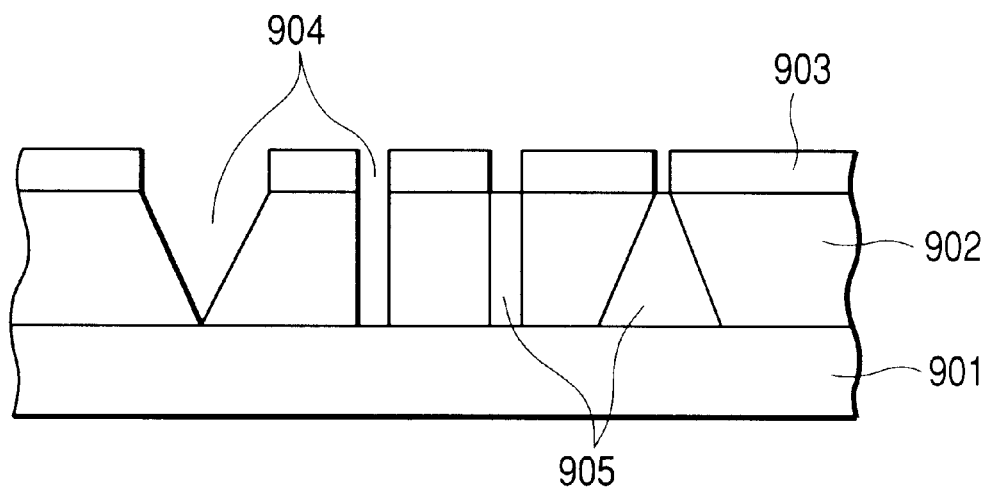
FIG. 9A is a schematic, cross-sectional view showing defective regions in a photovoltaic element according to the present invention.
Figure 9B:
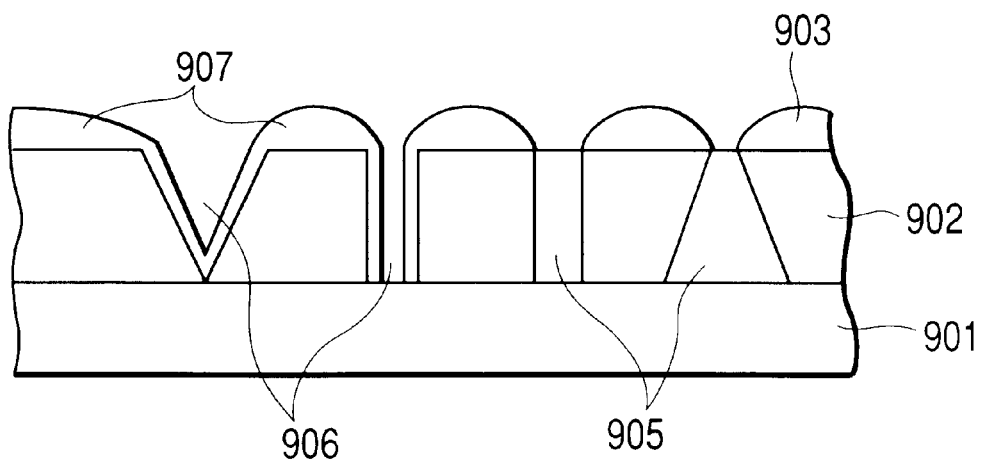
FIG. 9B is a schematic, cross-sectional view showing defective regions in an ordinary photovoltaic element.

According to the present invention, the defective regions (low-resistance regions) are selectively removed even if the sheet resistance of the transparent electrode film (e.g., the ITO film (indium tin oxide film)) is low. The reason for it will be described referring to FIGS. 9A and 9B. FIG. 9A shows a photovoltaic element produced by the sputtering method according to the present invention, and FIG. 9B a photovoltaic element produced by the ordinary sputtering method. As shown in FIGS. 9A and 9B, comparison is made between the defective regions of the two photovoltaic elements.

Numeral 901 designates a substrate, 902 an Si layer, 903 a transparent, conductive film, 904 defective regions, 905 defective Si films, 906 defective regions (having the transparent, conductive film), and 907 portions from which the good, transparent, conductive film was removed by electrolyte passivation.

In the photovoltaic element made by the ordinary sputtering method, the ITO film is uniformly deposited over both the defective regions and the non-defective regions, because the bias voltage is not applied to the substrate, different from the present invention. It was thus verified that the passivation in the electrolyte also removed even the good ITO film around the defective regions of low resistance.

In the photovoltaic element made by the sputtering method according to the present invention, the negative charge is concentrated on the defective regions because of the application of the bias to the substrate, so that Ar ions (cations) may implement local sputtering. Namely, the sputtering according to the present invention causes the transparent electrode film to be anisotropically etched, whereby the transparent electrode film can be selectively removed from only the defective regions.

After the sputtering, the electrolytic passivation may be further carried out.

Since the ITO film made under control of the In emission intensity ratio has stable film quality and has already been treated by the aforementioned anisotropic etching, the good ITO film will not be removed even if the further passivation is carried out in the electrolyte. Namely, the present invention can relieve the problem of removal of the good ITO film from the regions except for the defective regions, which arises in the ordinary electrolyte passivation.

In contrast to it, when the photovoltaic element produced by the ordinary sputtering method is subjected to the electrolyte passivation, as shown in FIG. 9B, the good, transparent, conductive film is removed thereby (the removed portions being denoted by 907).

The sentence "substantially no ITO film is formed on the defective regions (or the good ITO film is not removed from the regions except for the defective regions)", stated in the sputtering method according to the present invention, means that in the characteristics of the photovoltaic element, the shunt dark (RshDK)is not less than 80 k$\Omega$·cm$^2$, RshDK is improved to about 300 k$\Omega$·cm$^2$ after the electrolyte passivation, and there is no deterioration (passivation marks) of the appearance.

Thanks to the above action, the photovoltaic element without deposition of the transparent, conductive film on the defective regions in the semiconductor layer is improved in the shunts of solar cell, the deterioration of appearance, etc., whereby the solar cell can be obtained with excellent characteristics and high yield.

Roll to Roll sputtering apparatus will be described below, but it is noted that the present invention is by no means intended to be limited to the Roll to Roll sputtering apparatus.

Figure 1:
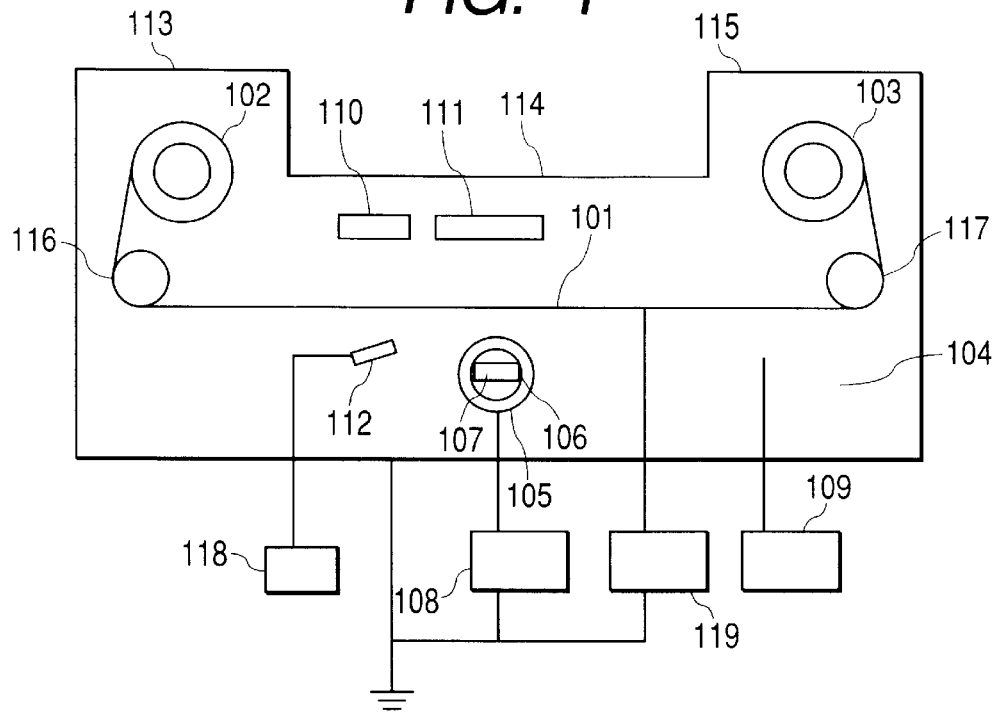
FIG. 1 is a schematic, cross-sectional view showing an example of apparatus for forming the transparent, conductive film by the reactive sputtering method in the present invention.

FIG. 1 is a cross-sectional view of a reactive sputtering apparatus using a cylindrical, rotatable target. In FIG. 1, a vacuum chamber 104 is comprised of a substrate feeding chamber 113, a film forming chamber 114, and a substrate winding chamber 115, the interior of each of which can be evacuated by a vacuum pump not shown. An elongated substrate 101 is wound on a substrate feeding roll 102, is conveyed from left to right by an unrepresented conveying means, and is wound up in proper alignment onto a substrate winding roll 103 via a steering mechanism 117. A cathode electrode 106 is cylindrical and a target 105 is bonded to the periphery of the cathode electrode 106. A magnet 107 and an unrepresented cooling means are provided inside the cathode electrode 106. A dc power supply 108 is connected with the vacuum chamber 104 as an anode, and the power is placed between the cathode electrode 106 and the vacuum chamber 104. A dc power supply 119 for applying the voltage to the substrate is also placed. Further, sheath heaters are used as heater 110 and heater 111. The heater 110 is located on a little left side (on the substrate feeding roll 102 side) with regard to the cathode electrode 106, while the heater 111 is located just over the cathode electrode 106. The heater 110 is one having the electric capacity greater than that of the heater 111. Particularly, immediately below the heater 111, the heat of the heaters flows from the top and the heat of the plasma flows from the bottom into the elongated substrate 101. The temperature is measured on the back surface (the upper surface in FIG. 1) of the elongated substrate 101 by a thermocouple kept in contact therewith. The powers to the heaters 110, 111 are controlled so as to keep the temperature constant. A thickness gage 109 is an optical interference type thickness gage. The apparatus constructed as described above may be operated automatically or manually, but in either case, it is preferable to mount an interlocking mechanism for the sake of safety.

The above apparatus is operated according to the following procedure. First, the substrate winding roll 102 with the elongated substrate 101 wound thereon is set in the substrate feeding chamber 113. Then, the elongated substrate 101 is routed in the order of the substrate feeding chamber 113, the film forming chamber 114, and the substrate winding chamber 115 to be fixed on the substrate winding roll 103, and is rolled thereon by approximately two to three turns. Then, a tension is exerted on the substrate by an unrepresented tension generating mechanism. Here, the elongated substrate 101 as an electroconductive substrate is electrically insulated (Japanese Patent Application Laid-Open No. 10-92766). On this occasion the insulating condition is confirmed.

Then, the film forming chamber 114 is evacuated to the vacuum degree of $10^{-3}$ Pa by the unrepresented vacuum pump. Then, the Ar gas is introduced to the vacuum degree of 0.3 Pa. Further, the outputs of the heater 110 and the heater 111 are controlled. The heater 110 and the heater 111 are energized and the outputs of the heater 110 and the heater 111 are controlled so that the temperature becomes 215° C. and 200° C. at the positions of the respective heaters on the back surface of the elongated substrate 101. After one hour has elapsed since the energization of the heater 110 and the heater 111, the power of 1.8 kW is applied from the target dc power supply 108 to the cathode electrode 106. After occurrence of Ar discharge is confirmed, $O_2$ gas is introduced and the elongated substrate 101 is conveyed at a conveyance speed of 1.5 m/min. Further, the sensitivity of the photomultiplier of the PEM is adjusted by the method disclosed in Japanese Patent Application Laid-Open No. 11-029863. For example, the PEM can be the plasma emission monitor PEM04 available from ARDENNNEANLAGENTECHNIK, or the like. The sensitivity adjusting method is a method of inducing discharge in only the Ar gas and adjusting the gain of the photomultiplier so that the plasma emission intensity becomes 900. After the adjustment, the $O_2$ gas is introduced to start film formation. When the deposited portion reaches a region above the thickness gage 109 through conveyance, the target value of the plasma emission intensity is adjusted so that an indication of the thickness gage becomes, for example, 60 nm. This adjustment is carried out as occasion may demand. The self bias voltage on the substrate in this state is desirably controlled in the range of 0 to −20 V.

Further, the self bias voltage is set to −30 to −90 V through use of the substrate dc power supply 119. The transparent, conductive film is produced under the condition that the self bias voltage becomes preferably −40 to −70 V and more preferably −50 to −60 V.

Then, the voltage of −90 V to −30 V is applied from the second power supply to the substrate and the emission intensity ratio of In is controlled in the range of 0.15 to 0.36. The emission intensity ratio of In is controlled preferably in the range of 0.16 to 0.35 and more preferably in the range of 0.17 to 0.34.

The numerical values of the self bias voltage and the In emission intensity ratio were derived from the results in Example 1 and Example 2 (FIGS. 4, 5, 7, and 8) described hereinafter.

After completion of the film formation on the elongated substrate 101 in a desired length, the $O_2$ gas, Ar gas, dc power supply 108, heater 110, and heater 111 all are stopped. Further, the conveyance of the elongated substrate 101 is terminated and after one-hour cooling, the pressure inside the vacuum chamber 104 is brought back to the atmospheric pressure. The product is then taken out.

Examples of the present invention will be described below in detail on the basis of the accompanying drawings, but it is noted that the present invention is by no means intended to be limited to these examples.

EXAMPLE 1

The present example describes a Roll to Roll sputtering apparatus of the reactive sputtering method. It is noted that the same idea can also apply similarly, irrespective of the method and apparatus, to any sputtering apparatus provided with the target and the substrate in the vacuum chamber and the independent external power supplies for applying the voltages to the target and the substrate, respectively. The apparatus may be provided with the PEM.

In the present example, using the apparatus shown in FIG. 1, the transparent, conductive film was formed with variation of the self bias voltage in the range of −150 V to 20 V, thereby producing solar cells.

Figure 3:
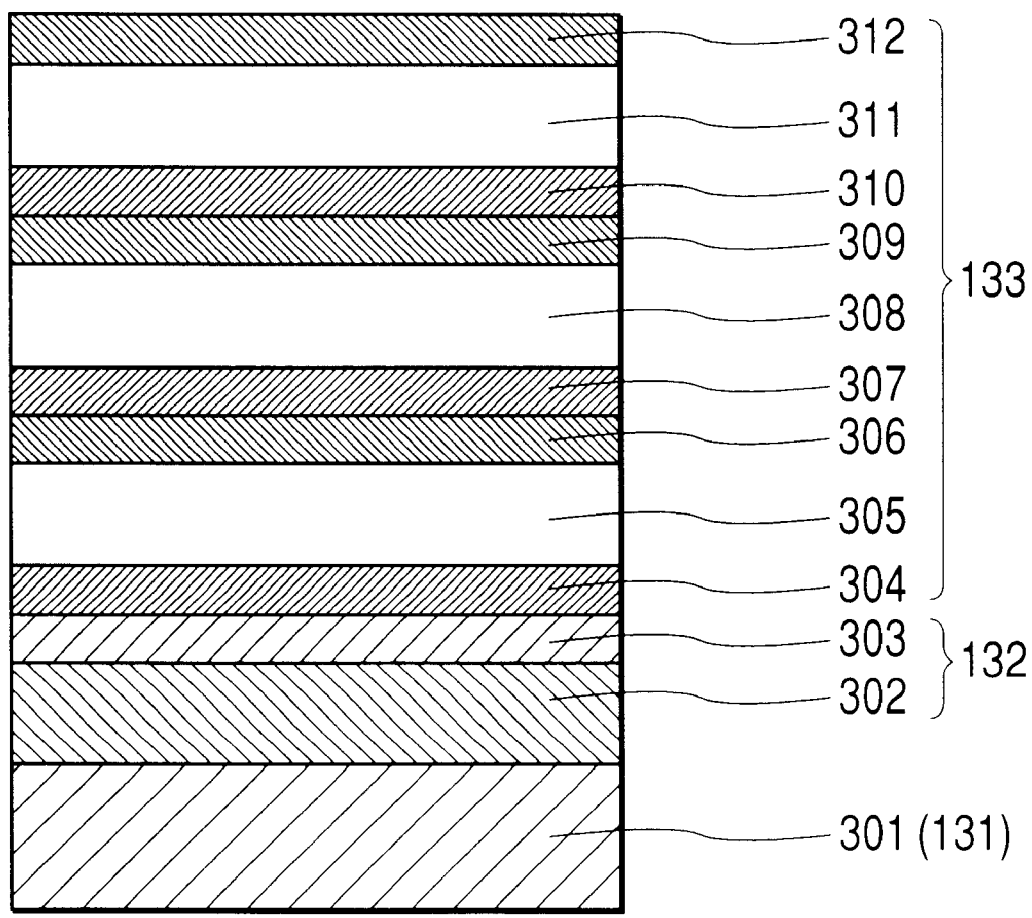
FIG. 3 is a schematic, cross-sectional view showing an example of a solar cell used in formation of the transparent, conductive film in the present invention.

The substrate 101 was one in which a semiconductor junction layer (of a triple cell type) 133 was provided through a reflecting layer 132 on an electroconductive base 131, as shown in FIG. 3. In FIG. 3, numeral 301 designates an electroconductive base, 302 an aluminum layer, 303 a zinc oxide layer, 304 an n-type a-Si layer, 305 an i-type a-SiGe layer, 306 a p-type a-Si layer, 307 an n-type a-Si layer, 308 an i-type a-SiGe layer, 309 a p-type a-Si layer, 310 an n-type a-Si layer, 311 an i-type a-Si layer, and 312 a p-type a-Si layer.

A method of forming the transparent, conductive film will be described below according to the production procedure thereof.

As shown from FIG. 1, the substrate 101 wound on the substrate feeding roll 102 was mounted in the substrate feeding chamber 113, and guided via feeding fixed roller 116 and steering roller 117 to be rolled onto the substrate winding roll 103. As a means for electrically insulating (or making in an electrically floating state) the conductive base, a polyimide film was bonded with a double-sided adhesive tape to the surface of each roller 102, 116, 117, 103 in contact with the conductive base 131.

Here, the electric resistance between the conductive base 131 and the vacuum chamber 104 was measured with a tester. The measured resistance was of MΩ (megaohm) order, which assured that the substrate 101 was electrically insulated (or made in an electrically floating state).

Using the vacuum pump not shown, the interior of the vacuum chamber 104 was evacuated to the vacuum degree of $10^{-3}$ Pa and thereafter Ar gas was introduced into the film forming chamber 114.

The preheater 110 and heater 111 were activated and the outputs thereof were controlled so that the thermocouple not shown (immediately below the heater 111) indicated 215° C. The target dc power supply 108 was turned on at one hour after the activation of the preheater 110 and heater 111 and $O_2$ was introduced in the state of 1.8 kW. After a lapse of ten minutes, the substrate 101 was started moving.

At the same time as arrival of the semiconductor junction layer 133 as conveyed, $O_2$ was stopped and the sensitivity of the photomultiplier of the PEM 118 was adjusted so that the emission intensity of In became 900. After that, $O_2$ was introduced again, and the introducing amount of the reactive gas $O_2$ was controlled so that the film thickness became 60 nm. Numeral 112 designates a collimator.

Since the self bias on the substrate herein was −20 V to 0 V, the voltage was applied in the range of −150 V to 20 V through use of the substrate dc power supply, thereby producing the transparent, conductive film.

Further, this transparent, conductive film roll was cut into 355 mm×240 mm by a cutter, solar cells obtained were immersed in an acid, salt, or alkali electrolyte, and a bias was applied to etch shunt portions.

The current collector electrode was further bonded and then was coated with acrylic urethane or the like, and the characteristics of the resultant solar cells were measured. The results of conversion efficiency characteristics were presented in FIG. 4, the results of dark shunt resistance (RshDK) in FIG. 5, and the results of Q-curve characteristics for checking the circumstances of Top current in FIGS. 6A and 6B.

Figure 4:
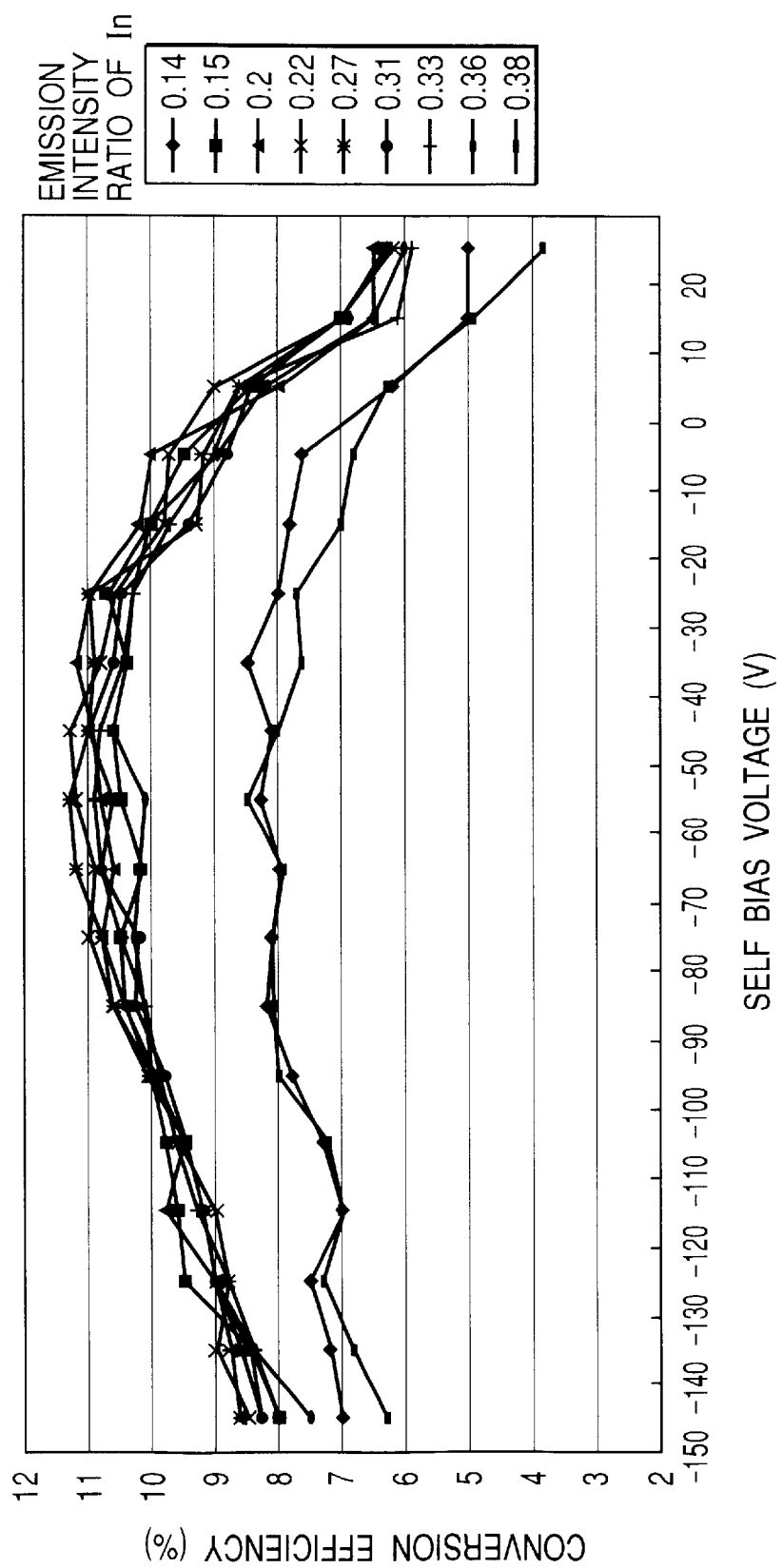
FIG. 4 is a graphical representation showing the results of conversion efficiency characteristics of solar cells where the transparent, conductive film was formed by the reactive sputtering method in the present invention.
Figure 5:
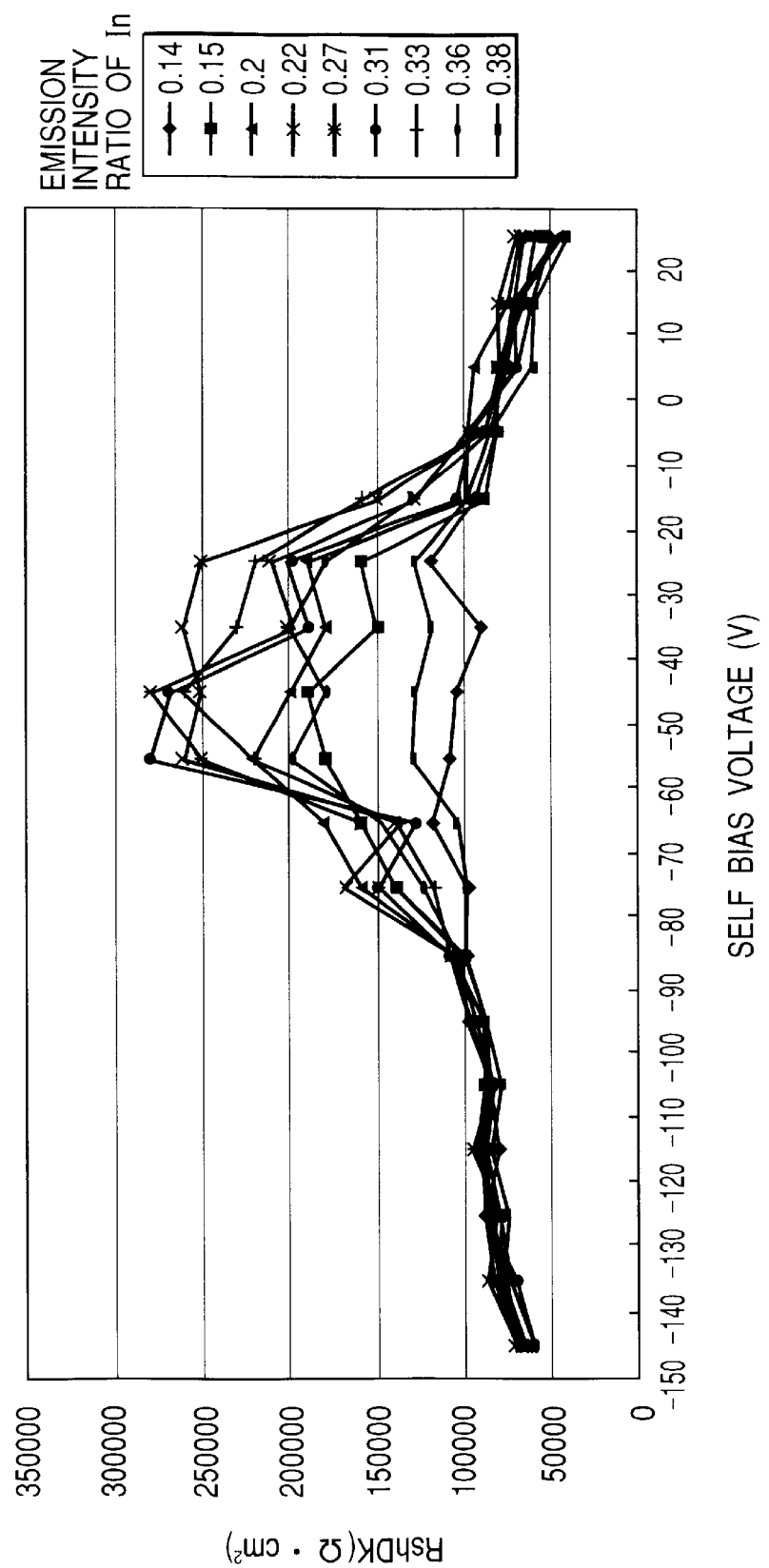
FIG. 5 is a graphical representation showing the results of RshDK characteristics of solar cells where the transparent, conductive film was formed by the reactive sputtering method in the present invention.
Figure 6A:
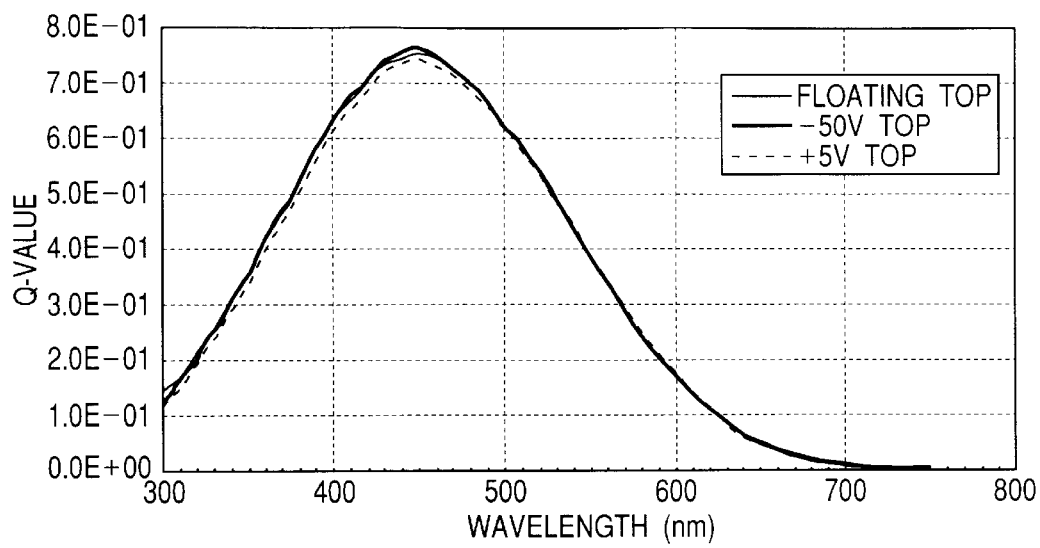
FIG. 6A is a graphical representation showing the results of Q-curve characteristics of solar cells where the transparent, conductive film was formed by the reactive sputtering method in the present invention.
Figure 6B:
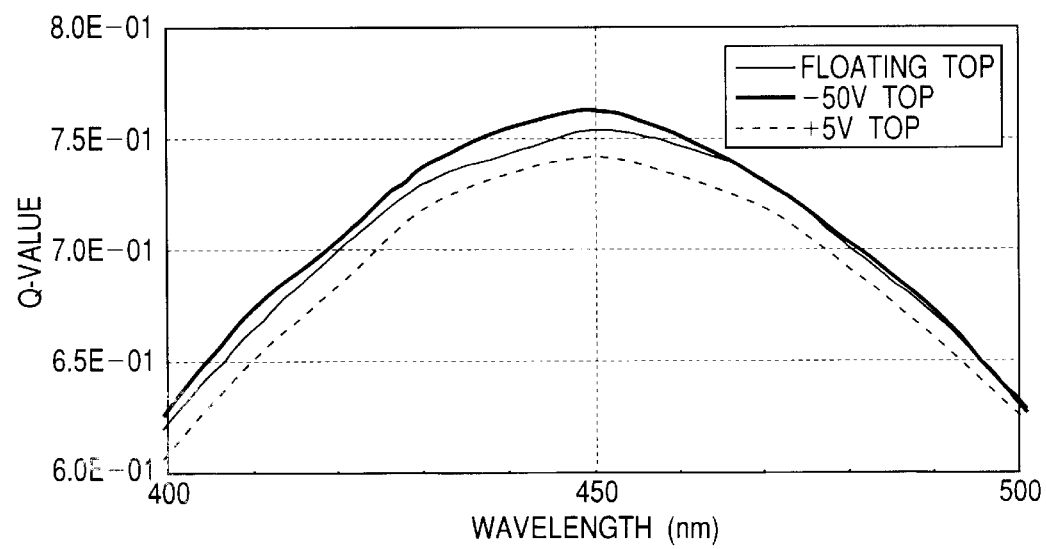
FIG. 6B is an enlarged view of FIG. 6A.

It is seen from the results of conversion efficiency characteristics of FIG. 4 and RshDK of FIG. 5 that the preferred range of the self bias applied to the substrate is −90 V to −30 V. The adequate range of the In emission intensity ratio was 0.15 to 0.36. Further, it was verified from the Q-curve characteristic results of FIGS. 6A and 6B that the transmittance was higher when the self bias applied to the substrate was −50 V than in the cases of floating and of +5 V.

The above verifies that the transmittance is improved and the conversion efficiency of solar cell is increased by carrying out the production method of the transparent, conductive film according to the present invention.

EXAMPLE 2

Figure 2:
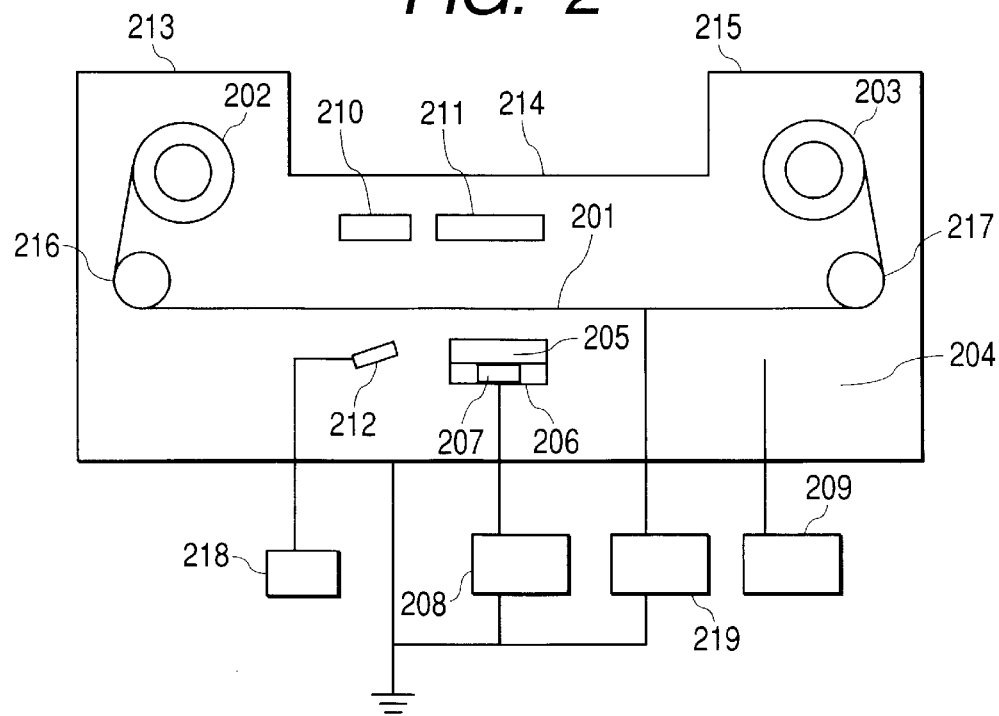
FIG. 2 is a schematic, cross-sectional view showing another example of apparatus for forming the transparent, conductive film by the reactive sputtering method in the present invention.

The present example is different from Example 1 in that the transparent, conductive film was formed in the apparatus shown in FIG. 2, using an oxide target of indium oxide and tin oxide (indium oxide: tin oxide 90:10 (wt %), the size= 10×20×¼ in.) as a target.

The transparent, conductive film was formed with variation of the self bias voltage in the range of −150 V to 20 V, to produce solar cells. The substrate 101 was one in which the semiconductor junction layer (of the triple cell type) 133 was provided through the back surface reflecting layer 132 on the conductive base 131, as shown in FIG. 3. In FIG. 3, numeral 301 designates an electroconductive base, 302 an aluminum layer, 303 a zinc oxide layer, 304 an n-type a-Si layer, 305 an i-type a-SiGe layer, 306 a p-type a-Si layer, 307 an n-type a-Si layer, 308 an i-type a-SiGe layer, 309 a p-type a-Si layer, 310 an n-type a-Si layer, 311 an i-type a-Si layer, and 312 a p-type a-Si layer.

A method of forming the transparent, conductive film will be described below according to the production procedure thereof.

As shown in FIG. 2, the substrate 201 wound on the substrate feeding roll 202 was mounted in the substrate feeding chamber 213, and guided via the feeding fixed roller 216 and steering roller 217 to be rolled onto the substrate winding roll 203. As a means for electrically insulating (or making in an electrically floating state) the conductive base 131, a polyimide film was bonded with a double-sided adhesive tape to the surface of each roller 202, 216, 217, 203 in contact with the conductive base 131.

Numeral 205 designates a target, 206 a cathode electrode, 207 a magnet, 209 a thickness gage, 212 a collimator, 215 a substrate winding chamber, and 219 a substrate dc power supply.

Here, the electric resistance between the conductive base 131 and the vacuum chamber 204 was measured with the tester. The measured resistance was of MΩ order, which assured that the substrate 201 was electrically insulated (or made in an electrically floating state).

Using the vacuum pump not shown, the interior of the vacuum chamber 204 was evacuated to the vacuum degree of $10^{-3}$ Pa level and thereafter Ar was introduced into the film forming chamber 214.

The preheater 210 and heater 211 were activated, and the outputs thereof were controlled so that the unrepresented thermocouple (immediately below the heater 211) indicated 215° C. After a lapse of one hour since the activation of the preheater 210 and heater 211, the target dc power supply 208 was turned on and $O_2$ was introduced in the state of 1.8 kW. After a lapse of ten minutes, the substrate 201 was started moving.

At the same time as arrival of the semiconductor junction layer 133 as conveyed, $O_2$ was stopped and the sensitivity of the photomultiplier of the PEM 218 was adjusted so that the In emission intensity became 900. After that, $O_2$ was introduced again, and the introducing amount of the reactive gas $O_2$ was controlled so that the film thickness became 60 nm.

Since the self bias on the substrate herein was −20 V to 0 V, the voltage was applied in the range of −150 V to 20 V through use of the substrate dc power supply, to produce the transparent, conductive film.

Further, this transparent, conductive film roll was cut into 355 mm×240 mm with the cutter, solar cells obtained were immersed in the acid, salt, or alkali electrolyte, and the bias was applied to etch shunt portions.

Further, the current collector electrode was bonded and then coated with acrylic urethane or the like, and the characteristics of the resultant solar cells were measured. The results of the conversion efficiency characteristics are presented in FIG. 7 and the results of the dark shunt resistance (RshDK) in FIG. 8.

Figure 7:
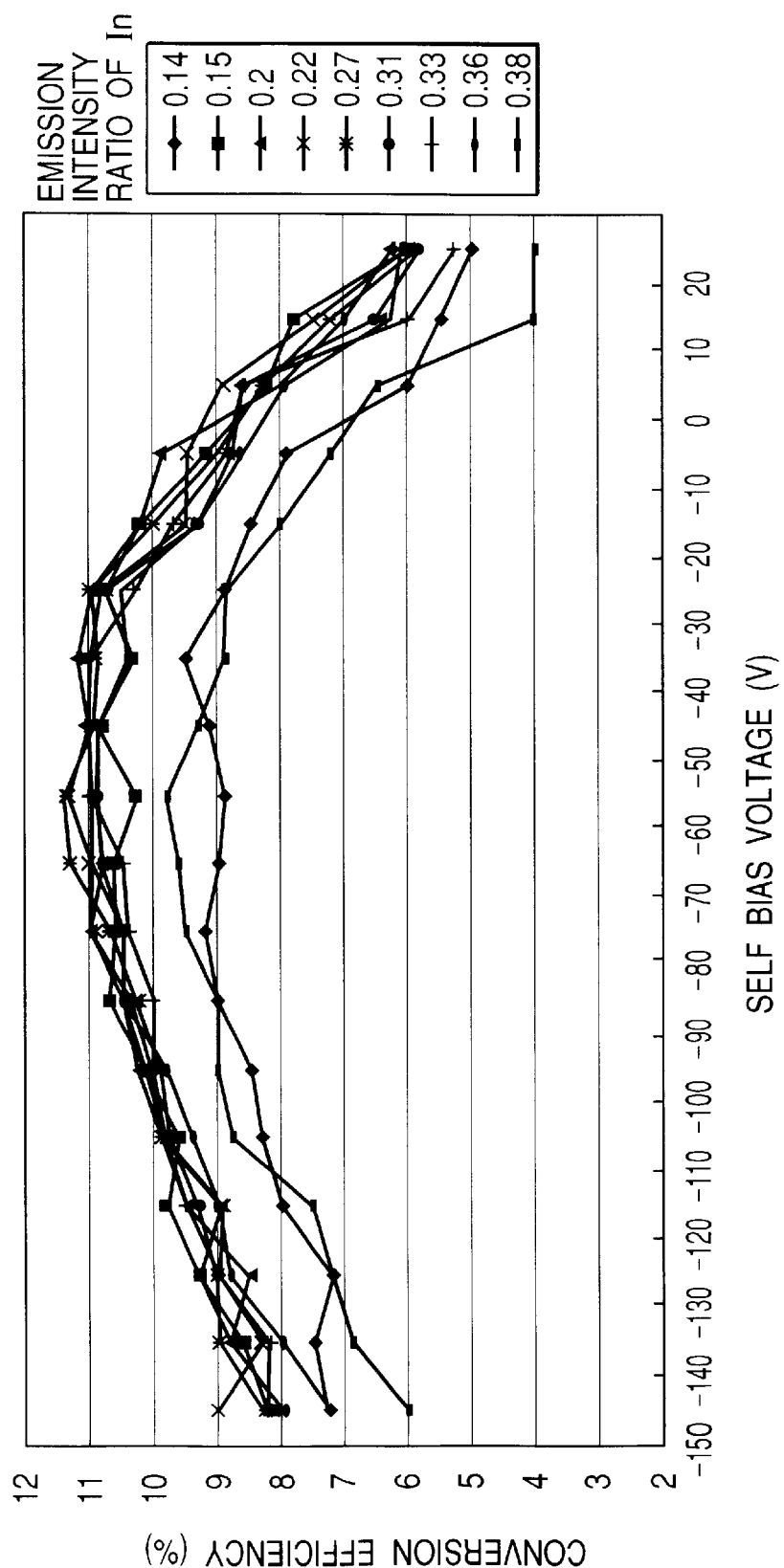
FIG. 7 is a graphical representation showing the results of conversion efficiency characteristics of solar cells where the transparent, conductive film was formed by the non-reactive sputtering method in the present invention.
Figure 8:
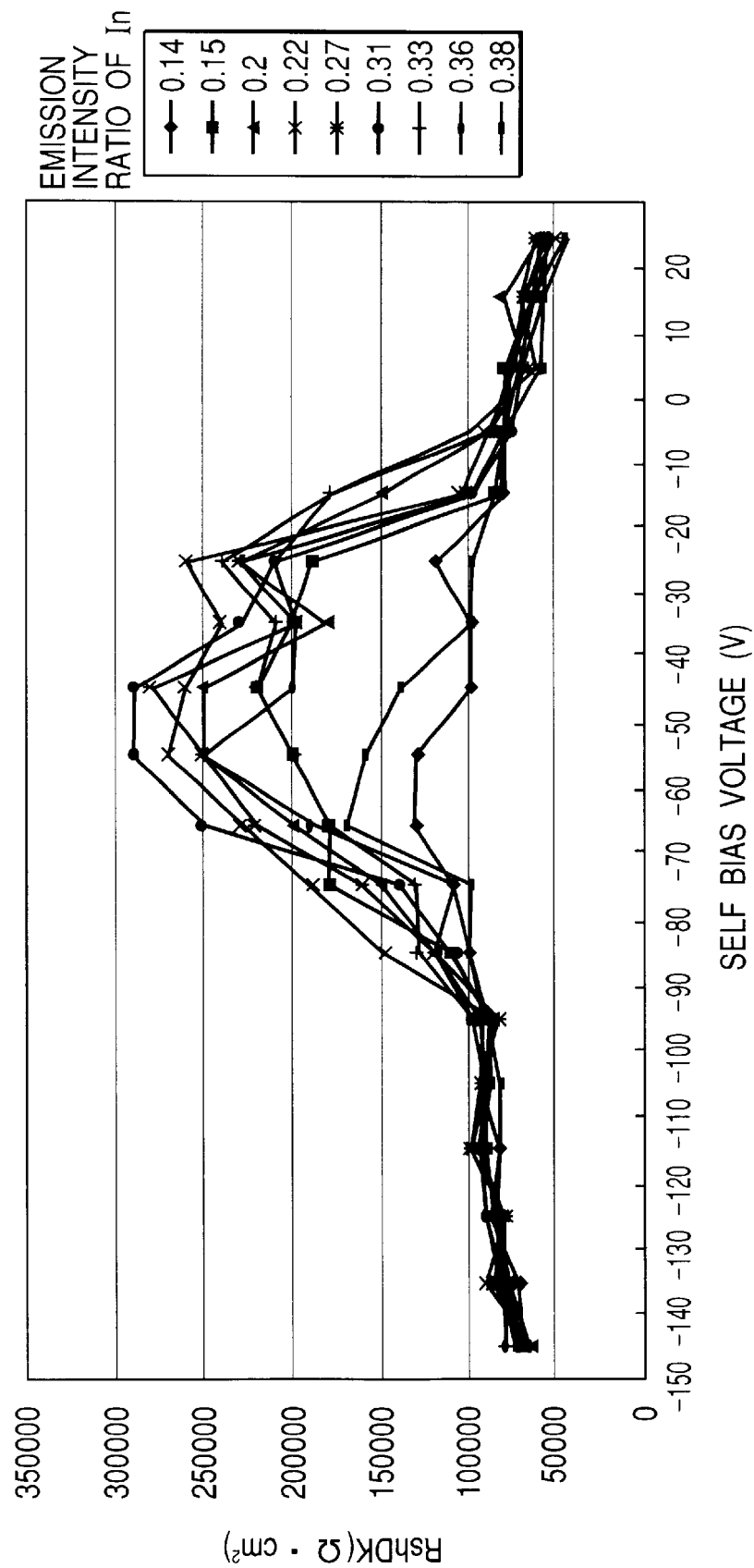
FIG. 8 is a graphical representation showing the results of RshDK characteristics of solar cells where the transparent, conductive film was formed by the non-reactive sputtering method in the present invention.

From the results of the conversion efficiency characteristics of FIG. 7 and RshDK of FIG. 8, the preferred range of the self bias applied to the substrate was −90 V to −30 V. The adequate range of the In emission intensity ratio was 0.15 to 0.36. This result was equivalent to that in Example 1.

Namely, it was confirmed that the sputtering method according to the present invention permitted use of both the reactive sputtering process and the non-reactive sputtering process. The above verifies that the conversion efficiency of solar cell is increased by carrying out the forming method of the transparent, conductive film according to the present invention.

EXAMPLE 3

With the solar cells produced under the conditions in Example 1, RshDK was measured without execution of the passivation (to immerse the solar cells in the acid, salt, or alkali electrolyte and apply the bias to etch the shunt portions). The results of the measurement are presented in Table 1.

It is seen from the results that when the transparent, conductive film forming method according to the present invention is carried out to implement the process of etching the semiconductor defective regions in the sputtering space, RshDK without the passivation is 92 kΩ·cm$^2$, which is within a level at which there arises no substantial problem.

The electrolyte passivation improves RshDK further to 300 kΩ·cm$^2$. This is conceivably because the transparent, conductive film forming method according to the present invention substantially removes the ITO film from on the defective portions and the electrolyte passivation dissolves only the regions at the defective portions.

Comparative Experiment 1

Using the sputtering apparatus of FIG. 1, films were formed under the following four conditions: (1) application of the substrate bias (−50 V)+within the adequate range of the In emission intensity ratio (0.2) according to the present invention; (2) application of the substrate bias (−50 V)+outside the adequate range of the In emission intensity ratio (0.39); (3) within the adequate range of the In emission intensity ratio (0.2)+application of the substrate bias (−200 V); (4) application of the substrate bias (−200 V)+outside the adequate range of the In emission intensity ratio (0.39). Measured values of RshDK (Ω·cm$^2$) of the cells made under the four conditions are presented in Table 2.

The results confirmed that since the etching process of the semiconductor defective regions was implemented in the sputtering space by the film formation under the condition of the application of the substrate bias+within the adequate range of the In emission intensity ratio (0.2) according to the present invention, RshDK was remarkably improved.

Comparative Experiment 2

The photovoltaic elements produced in Comparative Example 1 were further immersed in the acid, salt, or alkali electrolyte, the bias was applied thereto, and the state of the defective regions of each element was checked. An electron microscope was used for observing cross sections of the elements herein. Schematic views of the elements are presented in FIGS. 9A and 9B.

Numeral 901 designates a SUS substrate with ZnO formed thereon, 902 an Si layer, 903 a transparent, conductive film (ITO (indium tin oxide) film), 904 defective regions, 905 defective Si films, 906 defective regions (with the ITO film), and 907 portions from which the good ITO film was removed by the electrolyte passivation.

As shown in FIGS. 9A and 9B, it is speculated that the execution of the sputtering method of the transparent, conductive film according to the present invention establishes the condition that potentials are applied to only the defective regions, dry etching with anisotropy (colliding direction) is implemented with Ar ions in the sputtering space, and no transparent, conductive film is deposited on the defective regions. It was also confirmed that the sputtering methods other than the present invention removed even the good transparent, conductive film because of the passivation in the electrolyte and the film became thinner (yellow).

As described above, the present invention achieved the defective region compensation effect of the semiconductor junction layer in the sputtering space, which made it feasible to improve the solar cell characteristics based on the improvement in the transmittance, increase RshDK, decrease the deterioration of the appearance of solar cell, and increase the yield.

Namely, the present invention is able to provide the transparent, conductive film forming method capable of forming the thin-film solar cell with excellent characteristics and high yield by sputtering, without occurrence of shunts and appearance deterioration, the defective region compensation method of a semiconductor layer, the photovoltaic element, and the production method thereof.

TABLE 1

| Electrolyte Passivation | Sample | RshDK ($\Omega \cdot cm^2$) | Conversion Efficiency (%) | Appearance |
|---|---|---|---|---|
| Not effected | −Bias (−50 V) | $9.2 \times 10^4$ | 10.2 | No defect |
|  | Floating (−13 V) | $6.4 \times 10^3$ | 9.1 | No defect |
| Effected | −Bias (−50 V) | $3.0 \times 10^5$ | 10.7 | No defect |
|  | Floating (−13 V) | $2.2 \times 10^5$ | 10.3 | Defective |

TABLE 2

|  | Within adequate range of emission intensity ratio of In (0.2) | Outside adequate range of emission intensity ratio of In (0.39) |
|---|---|---|
| Within adequate range of bias (−50 V) | RshDK = $3.0 \times 10^5$ ($\Omega \cdot cm^2$) | RshDK = $6.5 \times 10^4$ ($\Omega \cdot cm^2$) |
| Outside adequate range of bias (−200 V) | RshDK = $4.3 \times 10^4$ ($\Omega \cdot cm^2$) | RshDK = $2.8 \times 10^3$ ($\Omega \cdot cm^2$) |

What is claimed is:

1. A method of forming a transparent, conductive film on a semiconductor layer formed on a substrate, by sputtering, comprising applying voltages independently of each other to both a target and the substrate, respectively, and controlling a bias voltage appearing in the substrate so as to form the transparent, conductive film on only a portion except for a defective region of the semiconductor layer.

2. The method according to claim 1, wherein prior to applying the voltages to both the target and the substrate independently of each other, a voltage is applied to only the target such that a self bias of the substrate is −20 V to 0 V, and wherein a self bias of the substrate is −90 V to −30 V when applying the voltage to both the target and the substrate, respectively, independently of each other.

3. The method according to claim 1, wherein a voltage from a first power supply is applied to the target and a voltage from a second power supply is applied to the substrate.

4. The method according to claim 1, wherein an introducing amount of a reactive gas is controlled such that a ratio of emission intensity of In during formation of the transparent, conductive film when applying the voltages to both the target and the substrate, respectively, independently of each other to emission intensity of In during discharge in only an Ar atmosphere is within range of 0.15 to 0.36.

5. A method of producing a photovoltaic element, comprising: forming a semiconductor layer on a substrate; and forming a transparent, conductive film on the semiconductor layer by the method as set forth in claim 1.

6. The method according to claim 5, wherein a back surface reflecting layer is stacked on the substrate, prior to the formation of the semiconductor layer on the substrate.

7. The method according to claim 5, wherein the photovoltaic element is produced using a roll system in which an elongated substrate is conveyed from a roll to a roll while being stretched between the rolls.

8. A method of forming a transparent, conductive film on a semiconductor layer formed on a substrate, by sputtering, comprising applying voltages independently of each other to both a target and the substrate, respectively, and controlling a bias voltage appearing in the substrate such that the RshDK of the semiconductor layer is no less than 80 k$\Omega \cdot cm^2$, wherein prior to applying the voltages to both the target and the substrate independently of each other, a voltage is applied to only the target such that a self-bias of the substrate is −20 V to 0 V, and wherein a self-bias of the substrate is −90 V to −30 V when applying the voltages to both the target and substrate independently of each other.

9. A method according to claim 8, further comprising immersing the transparent, conductive film is an acid salt, or alkali electrolyte and applying a bias.

* * * * *

UNITED STATES PATENT AND TRADEMARK OFFICE
CERTIFICATE OF CORRECTION

PATENT NO.    : 6,716,324 B2
DATED         : April 6, 2004
INVENTOR(S)   : Toshihiro Yamashita et al.

It is certified that error appears in the above-identified patent and that said Letters Patent is hereby corrected as shown below:

Column 13,
Line 41, "voltage" should read -- voltages --.

Column 14,
Lines 13 and 14, "forming" should begin a new paragraph.
Line 20, "a roll" should read -- a roll to roll --.
Line 28, "no less" should read -- not less --.
Line 38, "is an acid" should read -- in an acid, --.

Signed and Sealed this

Twenty-sixth Day of October, 2004

JON W. DUDAS
*Director of the United States Patent and Trademark Office*